United States Patent
Chen

(10) Patent No.: US 11,470,715 B2
(45) Date of Patent: Oct. 11, 2022

(54) EMBEDDED COMPONENT STRUCTURE AND MANUFACTURING METHOD THEREOF

(71) Applicant: Unimicron Technology Corp., Taoyuan (TW)

(72) Inventor: Yu-Shen Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 134 days.

(21) Appl. No.: 17/009,720

(22) Filed: Sep. 1, 2020

(65) Prior Publication Data

US 2022/0022311 A1 Jan. 20, 2022

(30) Foreign Application Priority Data

Jul. 14, 2020 (TW) ................................. 109123678

(51) Int. Cl.
| | | |
|---|---|---|
| *H01L 23/498* | (2006.01) | |
| *H05K 1/02* | (2006.01) | |
| *H01L 21/48* | (2006.01) | |
| *H01L 23/367* | (2006.01) | |

(52) U.S. Cl.
CPC ....... *H05K 1/0207* (2013.01); *H01L 21/4857* (2013.01); *H01L 21/4882* (2013.01); *H01L 23/3675* (2013.01); *H01L 23/49822* (2013.01); *H01L 23/49838* (2013.01)

(58) Field of Classification Search
CPC ................ H05K 1/0203; H05K 1/0207; H01L 23/49822; H01L 21/4857
See application file for complete search history.

(56) References Cited

U.S. PATENT DOCUMENTS

| | | | |
|---|---|---|---|
| 6,081,037 A * | 6/2000 | Lee | H01L 23/13 257/E21.511 |
| 2006/0038278 A1* | 2/2006 | Wang | H01L 23/13 257/E23.101 |
| 2006/0145328 A1* | 7/2006 | Hsu | H05K 1/185 257/690 |
| 2008/0315398 A1* | 12/2008 | Lo | H01L 23/5389 257/706 |
| 2015/0115433 A1* | 4/2015 | Lin | H01L 23/5389 438/122 |
| 2017/0047264 A1* | 2/2017 | Im | H01L 23/36 |
| 2019/0237410 A1 | 8/2019 | Kim et al. | |
| 2020/0126883 A1* | 4/2020 | Wang | H01L 23/49822 |
| 2020/0321257 A1* | 10/2020 | Kang | H01L 24/20 |
| 2022/0022311 A1* | 1/2022 | Chen | H01L 23/3677 |

FOREIGN PATENT DOCUMENTS

| | | |
|---|---|---|
| TW | I260756 | 8/2006 |
| TW | I581688 | 5/2017 |

* cited by examiner

*Primary Examiner* — Nicholas J Tobergte
(74) *Attorney, Agent, or Firm* — JCIPRNET

(57) ABSTRACT

An embedded component structure includes a circuit board, a chip, and a heat dissipation element. The chip is embedded in the circuit board. The heat dissipation element surrounds the chip. The chip, the circuit board, and the heat dissipation element are electrically connected. The heat dissipation element includes a first part, a second part, and a third part located between the first part and the second part. The first part is in direct contact with a side wall of the chip. The second part is a ground terminal. A method for manufacturing an embedded component structure is also provided.

10 Claims, 14 Drawing Sheets

EMBEDDED COMPONENT STRUCTURE AND MANUFACTURING METHOD THEREOF

CROSS-REFERENCE TO RELATED APPLICATION

This application claims the priority benefit of Taiwan application serial no. 109123678, filed on Jul. 14, 2020. The entirety of the above-mentioned patent application is hereby incorporated by reference herein and made a part of this specification.

BACKGROUND OF THE DISCLOSURE

1. Field of the Disclosure

The disclosure relates to an electronic component and a manufacturing method thereof, and in particular, to an embedded component structure and a manufacturing method thereof.

2. Description of Related Art

In recent years, an embedded chip is usually used to reduce a carrying area on a circuit board in an electronic product. However, since the embedded chip is usually surrounded by a material (such as resin) with poor thermal conductivity, waste heat often cannot be discharged effectively and properly. In addition, with the improvement of chip performance, power consumption of the chip also increases, which will make the problem of waste heat accumulation of the chip more obvious.

Furthermore, when the chip is in operation, a large amount of heat is easily produced. If the heat is not properly discharged, it will easily shorten life or even damage the chip due to high temperature. Therefore, how to effectively discharge the waste heat to alleviate the problem of shortened life or even damage to the chip due to overheating has become a great challenge for researchers in the art.

SUMMARY OF THE DISCLOSURE

The disclosure provides an embedded component structure and a manufacturing method thereof, which may effectively discharge the waste heat to alleviate the problem of shortened life or even damage to the chip due to overheating.

An embedded component structure of the disclosure includes a circuit board, a chip, and a heat dissipation element. The chip is embedded in the circuit board. The heat dissipation element surrounds the chip. The chip, the circuit board, and the heat dissipation element are electrically connected. The heat dissipation element includes a first part, a second part, and a third part located between the first part and the second part. The first part is in direct contact with a side wall of the chip. The second part is a ground terminal. A method for manufacturing an embedded component structure is further provided.

In an embodiment of the disclosure, the heat dissipation element penetrates a circuit board.

In an embodiment of the disclosure, the first part and the third part form a groove, and the chip is disposed in the groove.

In an embodiment of the disclosure, the chip has an active surface and a back surface opposite to the active surface, and the active surface faces up in the groove.

In an embodiment of the disclosure, the back surface of the chip faces the third part.

In an embodiment of the disclosure, the third part is a part of the circuit board.

In an embodiment of the disclosure, materials of the first part and the second part are substantially the same.

In an embodiment of the disclosure, a thermal conductivity of the material is between 200 W/(m*K) and 500 W/(m*K).

In an embodiment of the disclosure, the material is copper.

In an embodiment of the disclosure, the heat dissipation element is in a closed ring shape when viewed from above.

A method for manufacturing an embedded component structure of the disclosure includes at least the following steps: providing a circuit board having a through hole, where the circuit board has a first surface and a second surface opposite to each other; the circuit board includes a heat dissipation layer having an upper surface and a lower surface opposite to each other; and the upper surface of the heat dissipation layer is exposed from the through hole; disposing a chip in the through hole; forming a dielectric layer on the first surface and the second surface to seal the chip and cover the lower surface of the heat dissipation layer; removing a first part of the dielectric layer to form a first opening from which the upper surface of the heat dissipation layer is exposed and a second opening from which the lower surface of the heat dissipation layer is exposed; and forming a thermal conductive material layer in the first opening and the second opening to form a heat dissipation element surrounding the chip, where the chip, the circuit board, and the heat dissipation element are electrically connected.

In an embodiment of the disclosure, the heat dissipation element includes a first part, a second part, and a third part located between the first part and the second part. The thermal conductive material layer in the first opening is the first part. The thermal conductive material layer in the second opening is the second part. The heat dissipation layer is the third part.

In an embodiment of the disclosure, the chip is disposed in the through hole by using an adhesive layer.

In an embodiment of the disclosure, a side wall and an active surface of the chip are exposed from the first opening.

In an embodiment of the disclosure, the step of exposing, by using the first opening, the side wall and the active surface of the chip includes: after the first part of the dielectric layer is removed, removing a second part of the dielectric layer to expand the first opening to expose a part of the side wall and the active surface of the chip.

In an embodiment of the disclosure, the side wall and the active surface of the chip are not exposed after the first part of the dielectric layer is removed.

In an embodiment of the disclosure, the second part of the dielectric layer is removed by performing a plasma process and a desmear process.

In an embodiment of the disclosure, the removing the first part of the dielectric layer further includes: forming a plurality of vias from which a pad on an active surface of the chip is exposed, and forming the thermal conductive material layer in the plurality of vias to form a plurality of conductive terminals, where the plurality of conductive terminals are electrically connected to the circuit board.

In an embodiment of the disclosure, the plurality of conductive terminals are columnar structures when viewed from above.

In an embodiment of the disclosure, the plurality of conductive terminals further includes an extension part extending toward an edge of the chip.

Based on the above, the embedded component structure of the disclosure may effectively discharge the waste heat through the design of the heat dissipation element, to alleviate the problem of shortened life or even damage to the chip due to overheating. Furthermore, the heat dissipation element surrounds the chip, and the first part thereof is in direct contact with the side wall of the chip, so that the chip may be in direct contact with the heat dissipation element with better thermal conductivity. Therefore, a heat dissipation path of the chip may be shortened to effectively discharge waste heat and alleviate the problem of shortened life or even damage to the chip due to overheating. In addition, because the heat dissipation element surrounds the chip and the second part of the heat dissipation element is a ground terminal, the embedded component structure of the disclosure may be further provided with an electromagnetic shielding effect, thereby improving the phenomenon of signal attenuation due to electromagnetic interference, and obtaining better signal integrity.

To make the foregoing features and advantages of the disclosure more comprehensible, a detailed description is made below with reference to the accompanying drawings by using embodiments.

BRIEF DESCRIPTION OF THE DRAWINGS

FIG. 1I is a schematic top view of a region C of FIG. 1F.

DESCRIPTION OF THE EMBODIMENTS

Figure 1A:
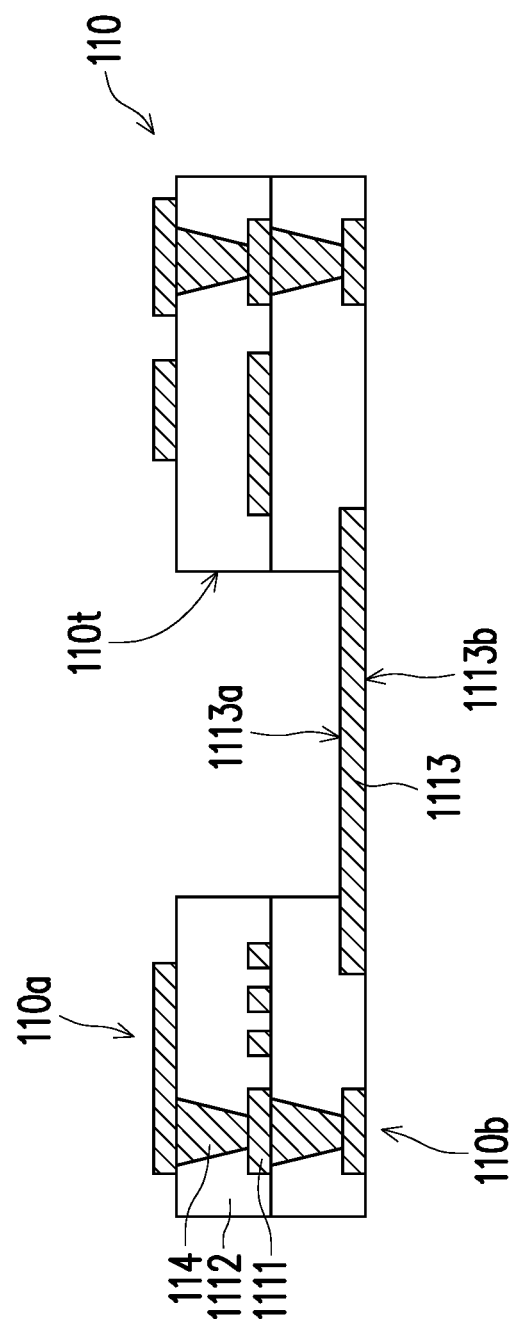
FIG. 1A to FIG. 1F are each a schematic cross-sectional diagram of a part of a manufacturing method of a part of an embedded component structure according to an embodiment of the disclosure.

The foregoing and other technical content, features, and effects of the disclosure can be clearly presented below in detailed description with reference to embodiments of the accompanying drawings. The directional terms mentioned herein, like "above", "below", "front", "back", "left", and "right", refer to the directions in the accompanying drawings. Therefore, the directional terms are only used for illustration instead of limiting the disclosure.

In the detailed description of the embodiments, the terms, like "first", "second", and "third", may be used for describing different elements. The terms are merely used for distinguishing between the elements, but these elements should not be limited by these terms in a structure. For example, a first element may be referred to as a second element, moreover, similarly, the second element may be referred to as the first element without departing from the protection scope of the ideas of the disclosure. In addition, in the manufacturing method, the formation sequence of the elements or components should also not be limited by these terms except specific manufacturing processes. For example, the first element may be formed before the second element, or the first element may be formed after the second element, or the first element and the second element may be formed in the same process or step.

In addition, the thickness of films and regions in the drawings may be enlarged for clarity. The same or similar reference numbers are used for representing the same or similar components, and details are not described below again.

FIG. 1A to FIG. 1F are each a schematic cross-sectional diagram of a part of a manufacturing method of a part of an embedded component structure according to an embodiment of the disclosure. FIG. 1G is a schematic top view of a region A of FIG. 1D. FIG. 1H is a schematic top view of a region B of FIG. 1E. FIG. 1I is a schematic top view of a region C of FIG. 1F. In the present embodiment, a process for manufacturing an embedded component structure 100 may include the following steps.

Referring to FIG. 1A, a circuit board 110 having a through hole 110t is provided, where the circuit board 110 has a first surface 110a and a second surface 110b opposite to each other. For example, the circuit board 110 may be formed by stacking a plurality of patterned conductive material layers 1111 and a plurality of dielectric material layers 1112, and the patterned conductive material layers 1111 may be electrically connected by using a plurality of buried holes 114. The first surface 110a may be composed of the uppermost patterned conductive material layer 1111 and a surface of the dielectric material layer 1112, and the second surface 110b may be composed of the lowermost patterned conductive material layer 1111 and a surface of the dielectric material layer 1112, but the disclosure is not limited thereto.

In the present embodiment, the circuit board 110 includes a heat dissipation layer 1113 having an upper surface 1113a and a lower surface 1113b opposite to each other. In other words, the heat dissipation layer 1113 may be a part of the circuit board 110. For example, when the material of the patterned conductive material layer 1111 has better thermal conductivity, for example, the thermal conductivity of the material of the patterned conductive material layer 1111 is between 200 Watts/(meter*absolute temperature) (W/(m*K)) and 500 W/(m*K), the heat dissipation layer 1113 may be a part of the patterned conductive material layer 1111, but the disclosure is not limited thereto.

In addition, the through hole 110t may penetrate a part of the circuit board 110 and expose the upper surface 1113a of the heat dissipation layer 1113, while the lower surface 1113b of the heat dissipation layer 1113 may be completely exposed. The through hole 110t is formed by using, for example, a laser process, a sandblasting process, or a plasma process, but the disclosure is not limited thereto.

Figure 1B:
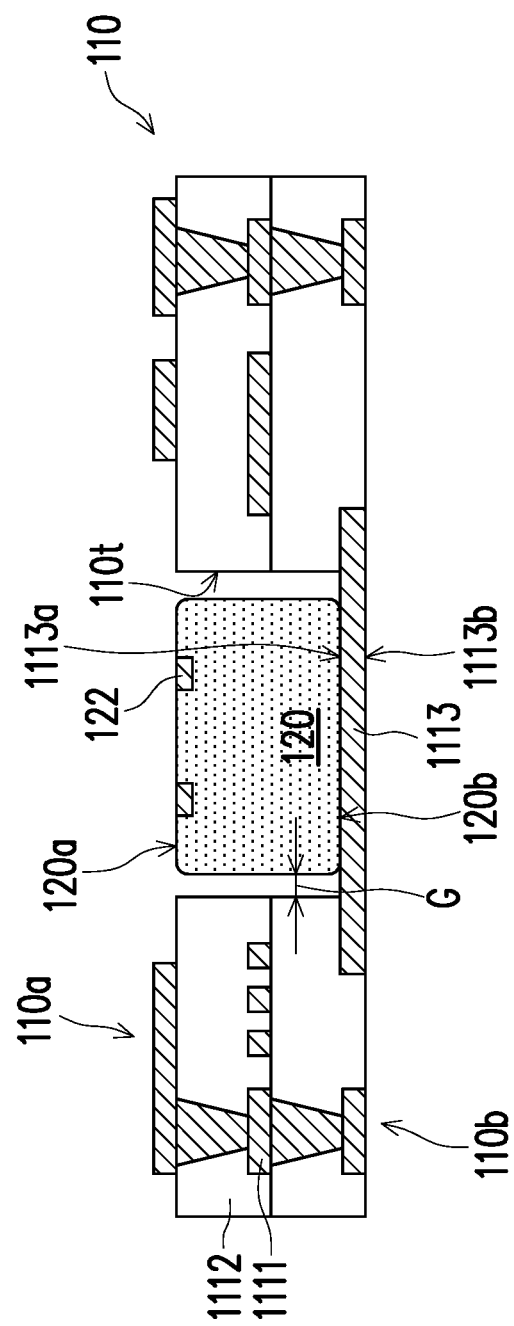

Referring to FIG. 1B, a chip 120 is disposed in the through hole 110t. Therefore, the chip 120 may be embedded in the circuit board 110. For example, the chip 120 may be disposed on the upper surface 1113a of the heat dissipation layer 1113. In the present embodiment, the chip 120 has an active surface 120a, a back surface 120b opposite to the active surface 120a, and a pad 122 on the active surface 120a, and the chip 120 may be disposed with the active surface 120a facing upward in the through hole 110t. In other words, the back surface 120b of the chip 120 may face the heat dissipation layer 1113.

In an embodiment, the chip 120 may be attached in the through hole 110t by using an adhesive layer (not shown). The adhesive layer may be formed by a die attach film (DAF) or other suitable materials, but the disclosure is not limited thereto. A type of the chip 120 may also be determined depending on actual design requirements.

In an embodiment, there may be a gap G between a plurality of chips 120 and a side wall of the through hole 110*t*. In other words, the chip 120 may not be in direct contact with the side wall of the through hole 110*t*, but the disclosure is not limited thereto.

Figure 1C:
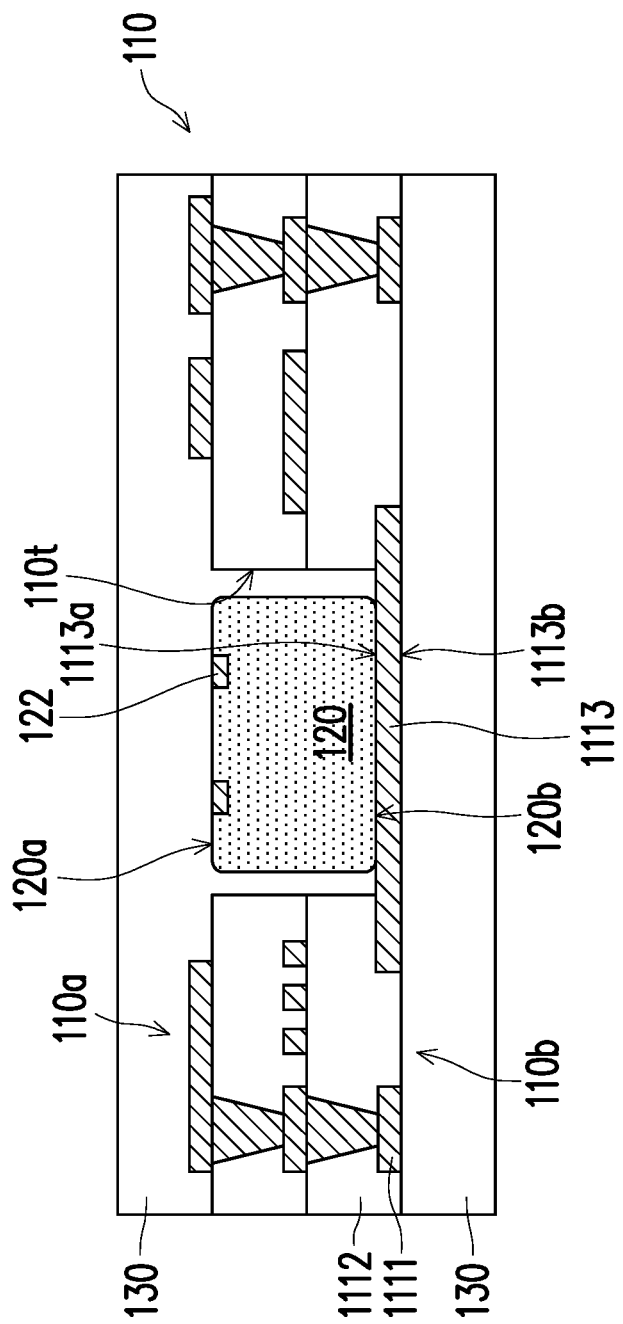

Referring to FIG. 1C, a dielectric layer 130 is formed on a first surface 110*a* and a second surface 110*b* to seal the chip 120 and cover a lower surface 1113*b* of a heat dissipation layer 1113. For example, the dielectric layer 130 may be filled in the through hole 110*t* and filled in the gap G (as shown in FIG. 1B) between the electronic component 120 and the circuit board 110, and completely formed on the second surface 110*b*.

In some embodiments, the dielectric layer 130 may be formed through a lamination process of resin (for example, epoxy or other similar thermosetting cross-linked resin), silane (for example, hexamethyldisiloxane (HMDSN), tetraethoxysilane (TEOS), bis (dimethylamino) dimethylsilane (BDMADMS)), or other suitable dielectric materials, but the disclosure is not limited thereto.

Figure 1D:
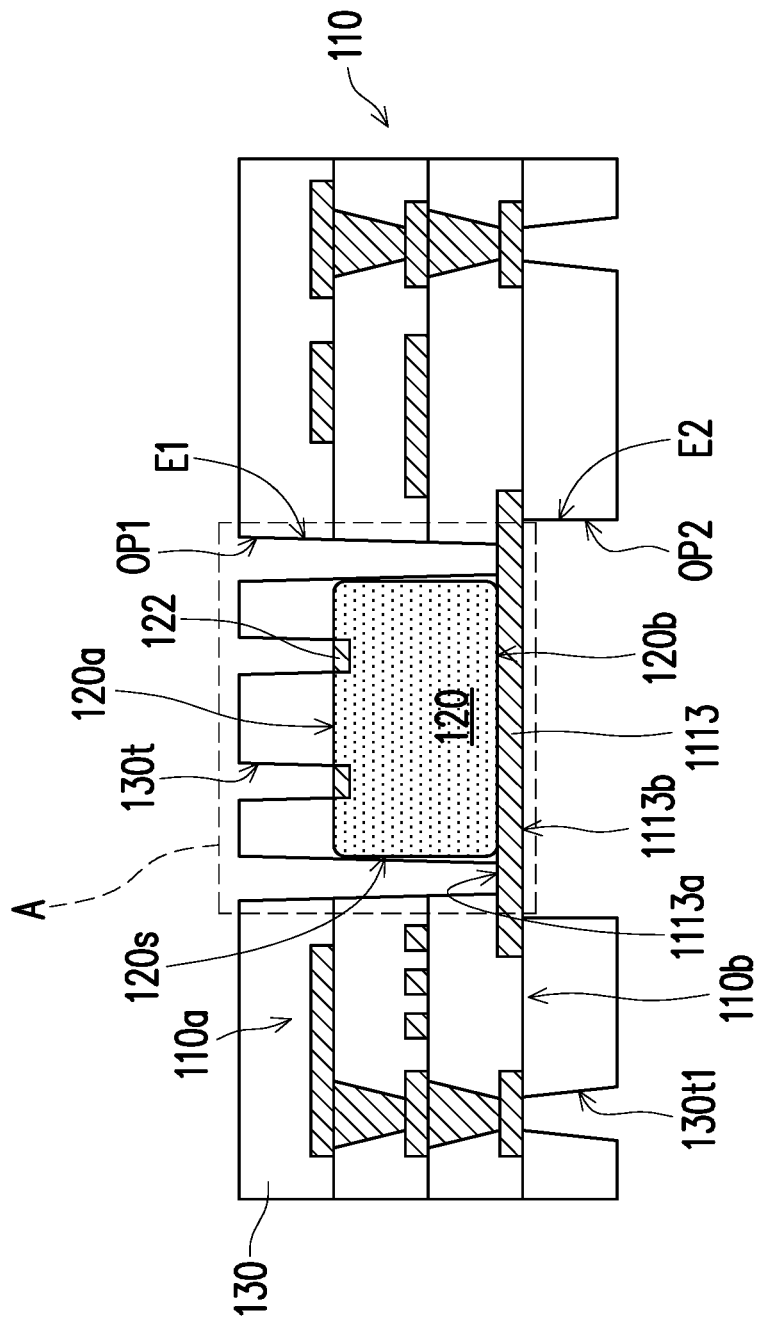
Figure 1E:
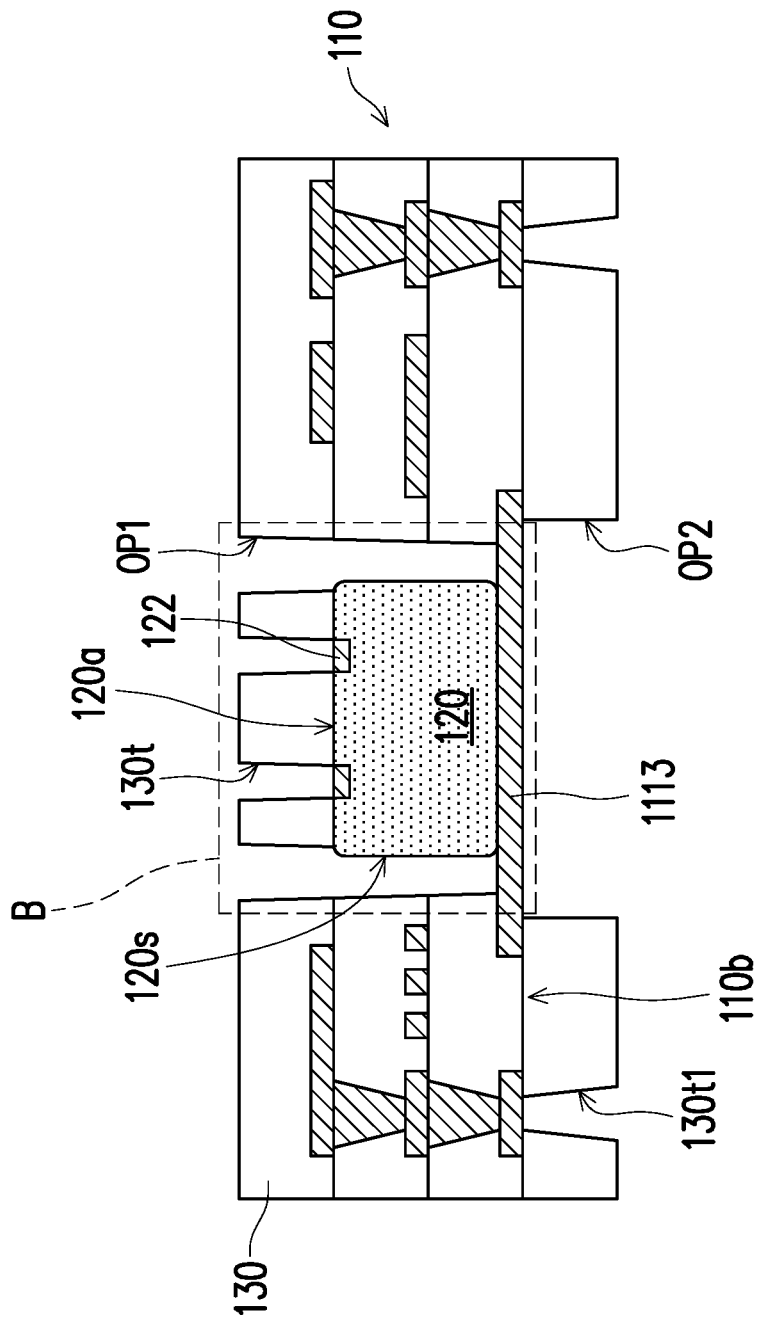

Referring to FIG. 1D, a first part of the dielectric layer 130 is removed to form a first opening OP1 from which an upper surface 1113*a* of a heat dissipation layer 1113 is exposed and a second opening OP2 from which a lower surface 1113*b* of the heat dissipation layer 1113 is exposed. Furthermore, for example, the first part of the dielectric layer 130 is removed by performing a laser drill process, a plasma process, or a sandblasting process.

In the present embodiment, when the first part of the dielectric layer 130 is removed, the first opening OP1 may not expose the active surface 120*a* and the side wall 120*s* of the chip 120. In other words, at this stage, the dielectric layer 130 may completely cover the chip 120. In addition, an orthographic projection of the first opening OP1 on the heat dissipation layer 1113 may be within an orthographic projection of the second opening OP2 on the heat dissipation layer 1113. In other words, an edge of the orthographic projection of the first opening OP1 on the heat dissipation layer 1113 may be retracted into an edge of the orthographic projection of the second opening OP2 on the heat dissipation layer 1113, but the disclosure is not limited thereto.

In the present embodiment, the removing the first part of the dielectric layer 130 may further include: forming a plurality of vias 130*t* from which a pad 122 on the active surface 120*a* of the chip 120 is exposed, for subsequent electrical connection between the chip 120 and the circuit board 110 or other components. In addition, based on circuit layout requirements, a part of the dielectric layer 130 located on the second surface 110*b* of the circuit board 110 may be selectively further removed, to form a via 130*t*1, as shown in FIG. 1D, but the disclosure is not limited thereto.

In an embodiment, as shown in FIG. 1G, the shape of the first opening OP1 may be a closed ring shape when viewed from above, so that the subsequently formed thermal conductive material layer may surely surround the chip 120, but the disclosure is not limited thereto. In other embodiments, the first opening OP1 may have other suitable shapes.

Referring to FIG. 1D to FIG. 1E and FIG. 1G to FIG. 1H together, after the first part of the dielectric layer 130 is removed, the second part of the dielectric layer 130 may be removed, to expand the first opening OP1 to expose a part of the side wall 120*s* and the active surface 120*a* of the chip. However, the disclosure is not limited thereto. In other embodiments, the side wall 120*s* and the active surface 120*a* of the chip 120 may also be exposed directly during removal of the first part of the dielectric layer 130.

Figure 1F:
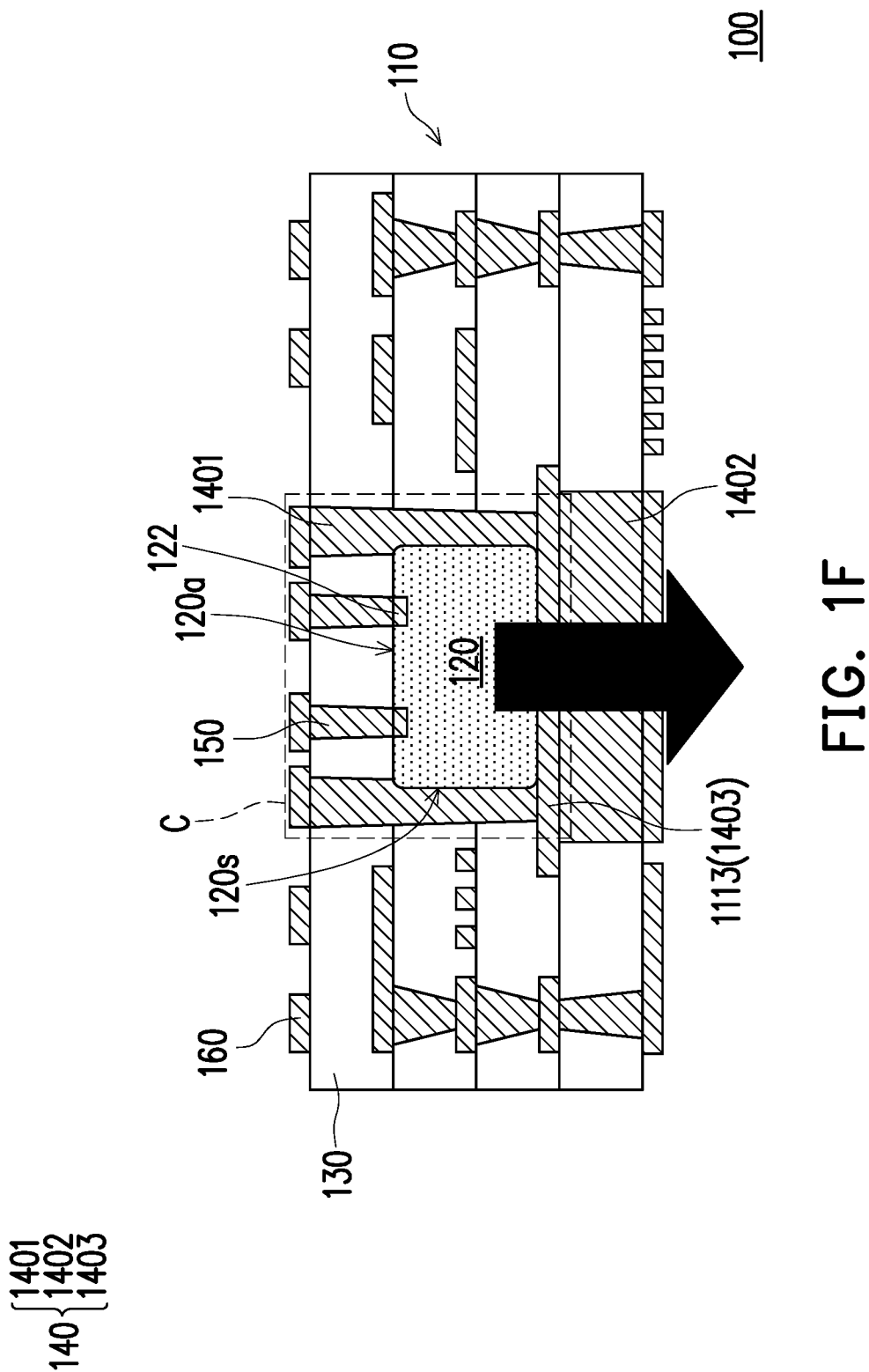
Figure 1G:
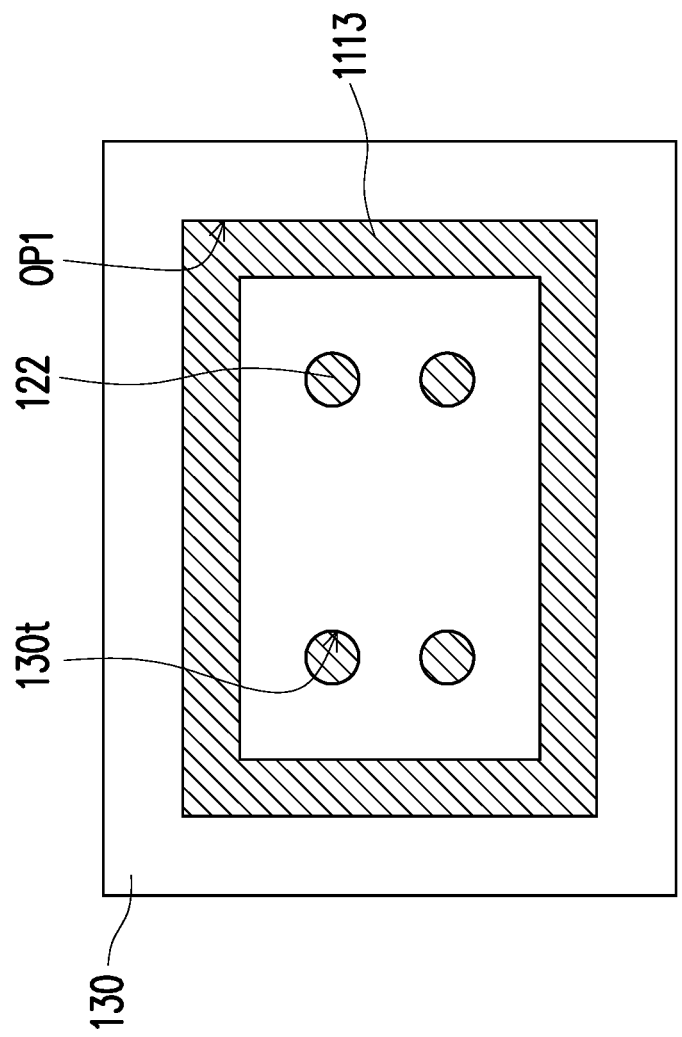
FIG. 1G is a schematic top view of a region A of FIG. 1D.
Figure 1H:
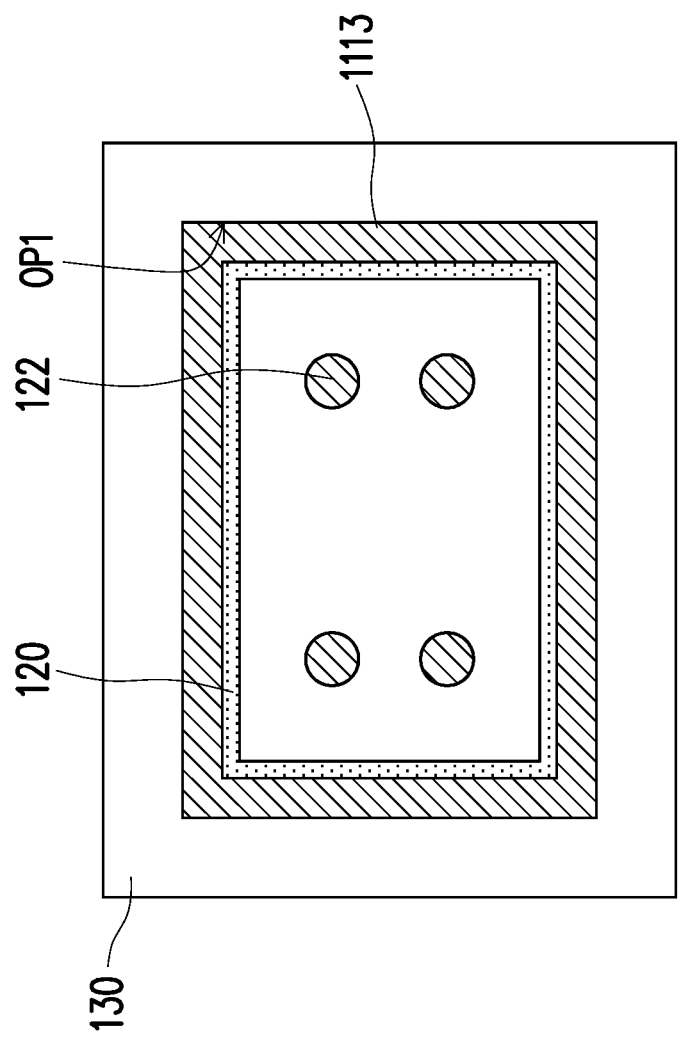
FIG. 1H is a schematic top view of a region B of FIG. 1E.
Figure 11:
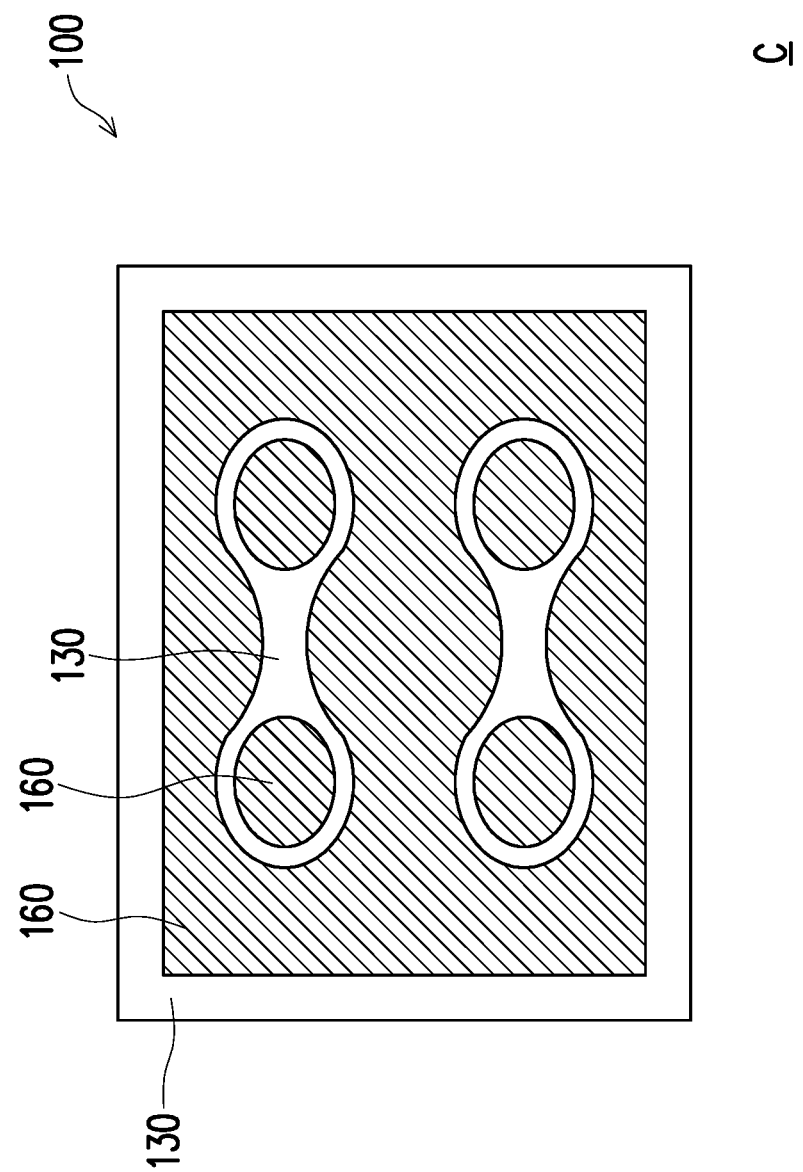

Referring to FIG. 1F and FIG. 1I together, a thermal conductive material layer is formed in the first opening OP1 and the second opening OP2 to form a heat dissipation element 140 surrounding the chip 120, where the chip 120, the circuit board 110, and the heat dissipation element 140 are electrically connected. For example, the heat dissipation element 140 may include a first part 1401, a second part 1402, and a third part 1403 between the first part 1401 and the second part 1402. The first part 1401 is in direct contact with a side wall 120*s* of the chip 120, and the second part 1402 is a ground terminal.

In the present embodiment, the embedded component structure 100 may effectively discharge the waste heat through the design of the heat dissipation element 140, to alleviate the problem of shortened life or even damage to the chip 120 due to overheating. Furthermore, the heat dissipation element 140 surrounds the chip 120, and the first part 1401 thereof is in direct contact with the side wall of the chip 120, so that the chip 120 may be in direct contact with the heat dissipation element 140 with better thermal conductivity. Therefore, a heat dissipation path of the chip may be shortened to effectively discharge waste heat and alleviate the problem of shortened life or even damage to the chip 120 due to overheating. In addition, because the heat dissipation element 140 surrounds the chip 120 and the second part 1402 of the heat dissipation element 140 is a ground terminal, the embedded component structure 100 of the disclosure may be further provided with an electromagnetic shielding effect, thereby improving the phenomenon of signal attenuation due to electromagnetic interference, and obtaining better signal integrity.

In an embodiment, the heat dissipation element 140 may penetrate the circuit board 110, the thermal conductive material layer in the first opening OP1 may be the first part 1401, the thermal conductive material layer in the second opening may be the second part 1402, and the heat dissipation layer 1113 may be the third part 1403, so that the third part 1403 may be a part of the circuit board 110.

In an embodiment, the first part 1401 and the third part 1403 may form a groove, and the chip 120 may face up in the groove. For example, the active surface 120*a* of the chip 120 may face up in the groove, and in other words, the back surface 120*b* of the chip 120 may face the third part 1403, but the disclosure is not limited thereto.

In some embodiments, the conductive material layer may be filled into the first opening OP1 and the second opening OP2 in the same process, and therefore materials of the first part 1401 and the second part 1402 may be substantially the same. For example, the materials of the first part 1401 and the second part 1402 have a thermal conductivity between 200 W/(m*K) and 500 W/(m*K), to discharge waste heat more effectively. In one embodiment, the material of the first part 1401 and the second part 1402 may be copper. Copper has better thermal conductivity, and may also enable the embedded component structure 100 to have better signal integrity, but the disclosure is not limited thereto.

It should be noted that the disclosure does not limit the materials of the first part 1401 and the second part 1402. In other embodiments, the conductive material layer may be filled in the first opening OP1 and the second opening OP2 in different processes, so that the materials of the first part 1401 and the second part 1402 may also be different.

In addition, since the first opening OP1 may be a closed ring when viewed from above, the heat dissipation element 140 formed in the first opening OP1 may also be a closed ring when viewed from above, but the disclosure is not limited thereto.

In the present embodiment, the thermal conductive material layer may further be formed in the plurality of vias 130t to form a plurality of conductive terminals 150, where the plurality of conductive terminals 150 are electrically connected to the circuit board 110. In addition, in a top view, the plurality of conductive terminals 150 may be columnar structures (not shown), but the disclosure is not limited thereto. Next, a build-up circuit 160 may be formed on the dielectric layer 130.

Through the foregoing manufacturing process, the manufacturing of the embedded component structure 100 of the present embodiment may be substantially completed. The embedded component structure 100 of the present embodiment includes a circuit board 110, a chip 120, and a heat dissipation element 140. The chip 120 is embedded in the circuit board 110. The heat dissipation element 140 surrounds the chip 120. The chip 120, the circuit board 110, and the heat dissipation element 140 are electrically connected. The heat dissipation element 140 includes a first part 1401, a second part 1402, and a third part 1403 located between the first part 1401 and the second part 1402. The first part 1401 is in direct contact with a side wall 120s of the chip 120. The second part 1402 is a ground terminal.

Figure 2A:
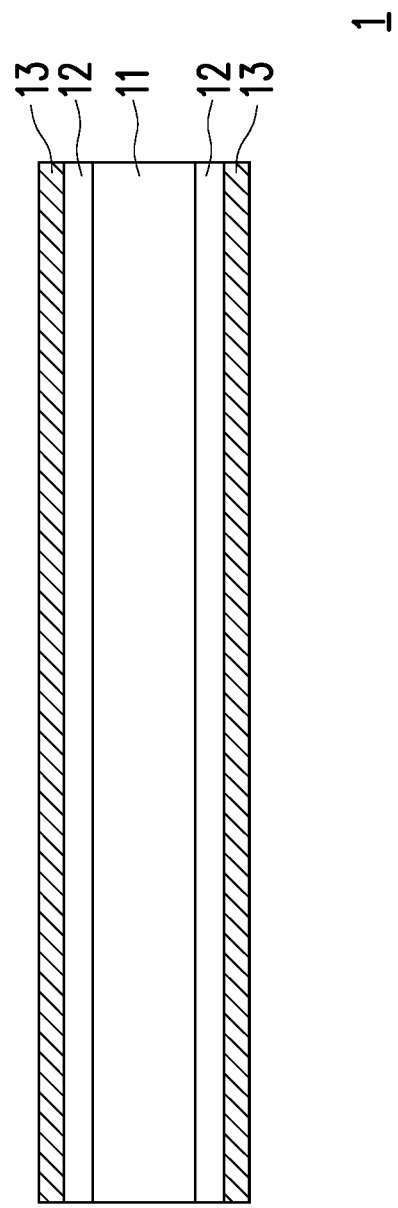
FIG. 2A to FIG. 2C are each a schematic cross-sectional diagram of a part of a manufacturing method of a circuit board of FIG. 1A.
Figure 2B:
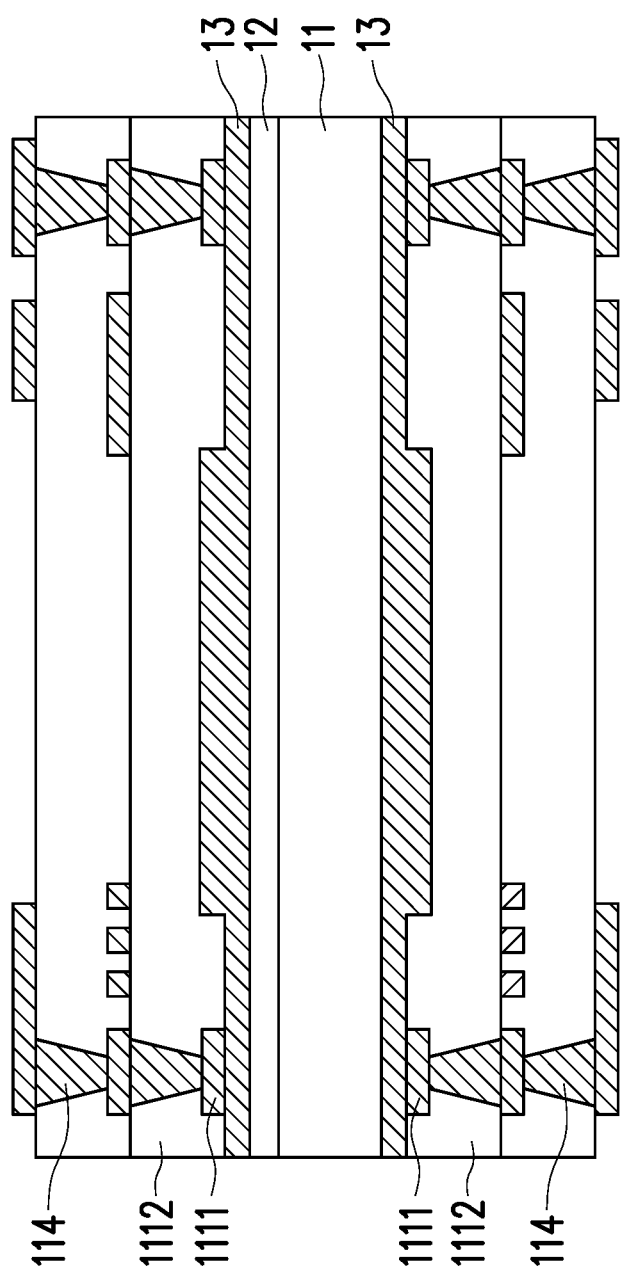
Figure 2C:
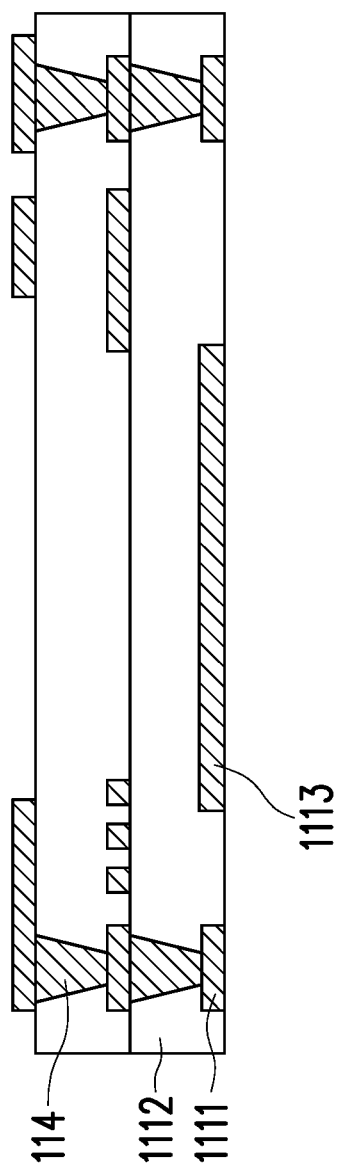

FIG. 2A to FIG. 2C are each a schematic cross-sectional diagram of a part of a manufacturing method of a circuit board of FIG. 1A.

Referring to FIG. 2A to FIG. 2C together, in an embodiment, for example, the circuit board 110 in FIG. 1A is formed by using the following steps.

First, as shown in FIG. 2A, a base 1 is provided, where the base 1 may include a core layer 11, a release layer 12, and a conductive material layer 13. The release layer 12 may be formed on the core layer 11, and the conductive material layer 13 may be formed on the release layer 12. For example, the release layer 12 and the conductive material layer 13 may be simultaneously formed on upper and lower surfaces of the core layer 11.

In some embodiments, the core layer 11 may include a polymer glass fiber composite substrate, a glass substrate, a ceramic substrate, an insulating silicon substrate, or a polyimide (PI) glass fiber composite substrate. However, the disclosure is not limited thereto, as long as the core layer 11 may be adapted to carry a film layer formed thereon or a component disposed thereon in the subsequent manufacturing process. In addition, the release layer 12 and the conductive material layer 13 may be made of any suitable release and conductive material.

Then, as shown in FIG. 2B and FIG. 2C, a plurality of patterned conductive material layers 1111 and a plurality of dielectric material layers 1112 are formed on the conductive material 13 on both sides, and then the core layer 11 and the release layer 12 are removed to form two circuit boards (only one is schematically shown in the figure). A plurality of buried holes 114 are formed between the plurality of patterned conductive material layers 1112, so that the plurality of patterned conductive material layers 1111 may be electrically connected. Herein, the patterned conductive material layer 1111, the dielectric material layer 1112, and the buried hole 114 may be formed by using suitable materials and methods, and the disclosure is not limited thereto.

In the present embodiment, the patterned conductive material layer 1111 includes a heat dissipation layer 1113 that may serve as the third part of the subsequent heat dissipation element 140. Then, a through hole 110t may be formed in the patterned dielectric material layer 1111 to form the circuit board 110 as shown in FIG. 1A. In an embodiment, for example, the core layer 11, the remaining release layer 12, and the conductive material layer 13 are removed by using an etching process, but the disclosure is not limited thereto.

It should be noted that the disclosure does not limit the method in which the circuit board 110 is formed, as long as the circuit board 110 has the through hole 110t, which shall fall within the protection scope of the disclosure.

Figure 3:
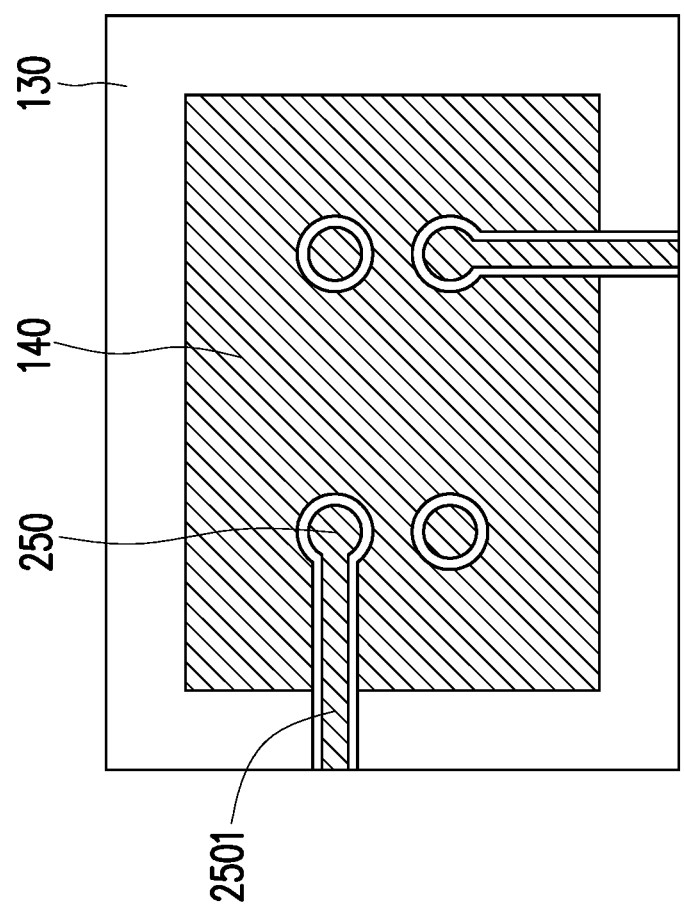
FIG. 3 is a schematic top view of an embedded component structure according to another embodiment of the disclosure.

FIG. 3 is a schematic top view of an embedded component structure according to another embodiment of the disclosure. A plurality of conductive terminals 250 of an embedded component structure 200 of the present embodiment are similar to a conductive terminal 150 of the embedded component structure 100 of FIG. 1I. A difference is that the plurality of conductive terminals 250 may further include an extension part 2501 extending toward an edge of the chip 120, to further increase elasticity of the embedded component structure 200 in application, but the disclosure is not limited thereto, and the conductive terminals of the embedded structure may be determined depending on the actual circuit design requirements.

Figure 4:
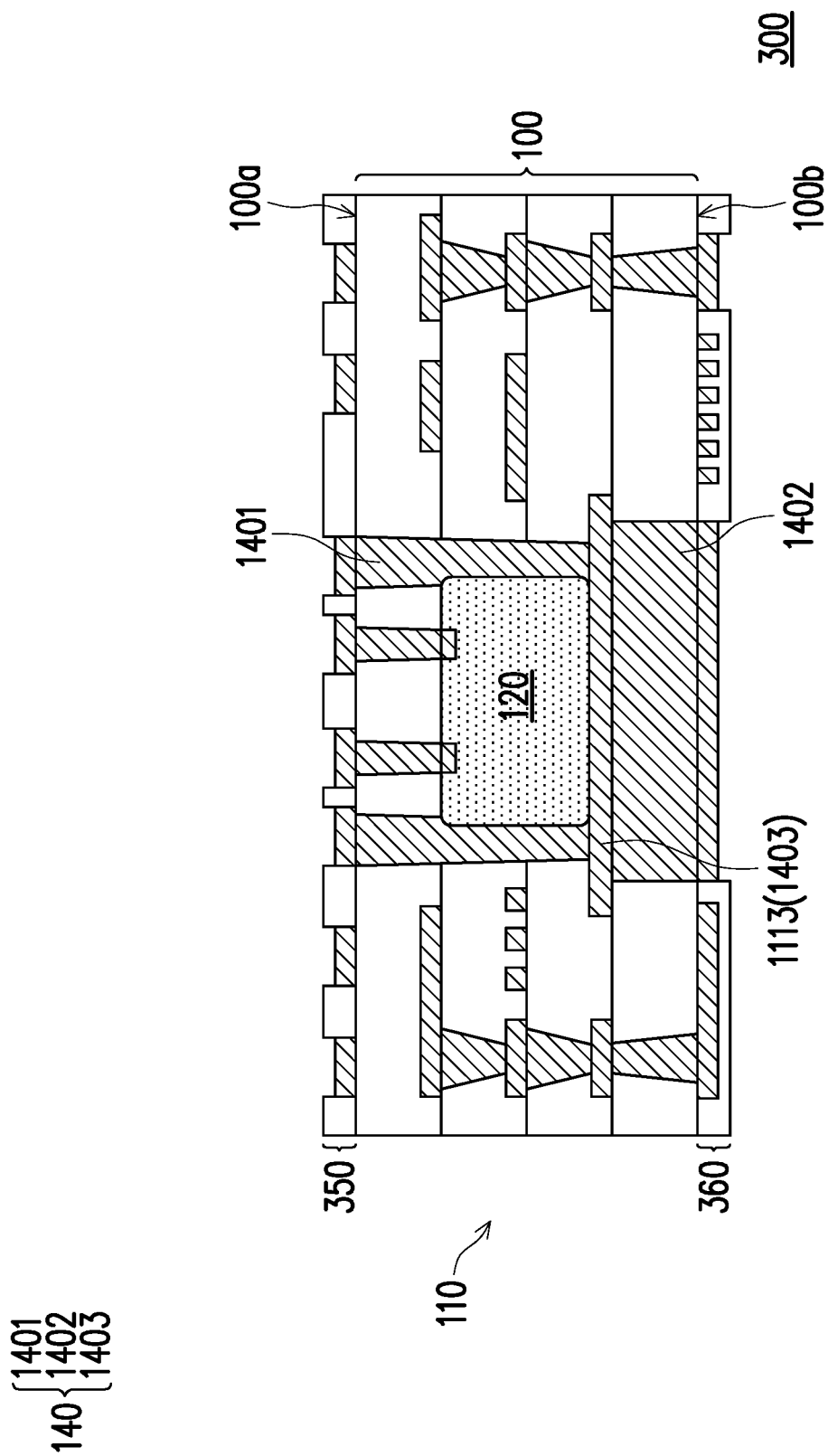
FIG. 4 is a schematic cross-sectional diagram of a part of an embedded component structure according to still another embodiment of the disclosure.

FIG. 4 is a schematic cross-sectional diagram of a part of an embedded component structure according to still another embodiment of the disclosure.

Referring to FIG. 4, similar to FIG. 1F, the difference is that the embedded component structure 300 of the present embodiment further forms a build-up circuit 350 on a first side 100a of the embedded component structure 100, and further forms a build-up circuit 360 on a second side 100b opposite to the first side 100a, so that the embedded component structure 300 may be further electrically connected subsequently.

Based on the above, the embedded component structure of the disclosure may effectively discharge the waste heat through the design of the heat dissipation element, to alleviate the problem of shortened life or even damage to the chip due to overheating. Furthermore, the heat dissipation element surrounds the chip, and the first part thereof is in direct contact with the side wall of the chip, so that the chip may be in direct contact with the heat dissipation element with better thermal conductivity. Therefore, a heat dissipation path of the chip may be shortened to effectively discharge waste heat and alleviate the problem of shortened life or even damage to the chip due to overheating. In addition, because the heat dissipation element surrounds the chip and the second part of the heat dissipation element is a ground terminal, the embedded component structure of the disclosure may be further provided with an electromagnetic shielding effect, thereby improving the phenomenon of signal attenuation due to electromagnetic interference, and obtaining better signal integrity.

Although the disclosure is disclosed above by using the embodiments, the embodiments are not used for limiting the disclosure. A person of ordinary skill in the art can make some equivalent variations and modifications without departing from the spirit and scope of the disclosure. Therefore, the protection scope of the disclosure should be subject to the appended claims.

What is claimed is:
1. An embedded component structure, comprising:
a circuit board;
a chip embedded in the circuit board; and
a heat dissipation element surrounding the chip, wherein the chip, the circuit board, and the heat dissipation element are electrically connected;

the heat dissipation element comprises a first part, a second part, and a third part located between the first part and the second part;

the first part is in direct contact with a side wall of the chip; and the second part is a ground terminal.

2. The embedded component structure according to claim 1, wherein the heat dissipation element penetrates the circuit board.

3. The embedded component structure according to claim 1, wherein the first part and the third part form a groove, and the chip is disposed in the groove.

4. The embedded component structure according to claim 3, wherein the chip has an active surface and a back surface opposite to the active surface, and the active surface faces up in the groove.

5. The embedded component structure according to claim 4, wherein the back surface of the chip faces the third part.

6. The embedded component structure according to claim 1, wherein the third part is a part of the circuit board.

7. The embedded component structure according to claim 1, wherein materials of the first part and the second part are substantially the same.

8. The embedded component structure according to claim 7, wherein a thermal conductivity of the material is between 200 watts/(meter*absolute temperature) and 500 watts/(meter*absolute temperature).

9. The embedded component structure according to claim 8, wherein the material is copper.

10. The embedded component structure according to claim 1, wherein the heat dissipation element is in a closed ring shape when viewed from above.

\* \* \* \* \*